United States Patent
Gama et al.

(10) Patent No.: US 6,339,809 B1
(45) Date of Patent: Jan. 15, 2002

(54) MEMORY UNIT AND BUFFER ACCESS CONTROL CIRCUIT FOR UPDATING AN ADDRESS WHEN CONSECUTIVELY ACCESSING UPPER AND LOWER BUFFERS

(75) Inventors: Shinkichi Gama; Takeshi Nagase; Yoshiki Okumura; Tomohiro Hayashi, all of Yokohama; Yoshihiro Takamatsuya, Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/281,232

(22) Filed: Mar. 30, 1999

(30) Foreign Application Priority Data

Jul. 30, 1998 (JP) .............................. 10-215275

(51) Int. Cl.[7] .............................. G06F 12/00; G11C 8/04
(52) U.S. Cl. .............................. 711/5; 711/218; 711/219; 710/52; 365/236
(58) Field of Search ................................ 711/218, 219, 711/5, 209; 365/236, 230.03, 230.04; 710/52, 53, 54

(56) References Cited

U.S. PATENT DOCUMENTS 5,309,398 A * 5/1994 Nagase et al. ......... 365/189.05
6,094,701 A * 7/2000 Mochizuki et al. ............. 711/5

* cited by examiner

Primary Examiner—Glenn Gossage
(74) Attorney, Agent, or Firm—Staas & Halsey LLP

(57) ABSTRACT

A buffer access control circuit to access a buffer which is divided into an upper buffer and a lower buffer which are assigned the same address and a memory unit including the buffer access control circuit. The buffer access control circuit includes latch circuits which store data in response to upper and lower buffer access signals, and a first detection circuit which detects whether data latched by the latch circuits match. A modifying circuit inputs data to the first and second latches or inputs inverted data to the first and second latches when one of the upper and lower buffer access signals is generated and the detection circuit detects a match. In this manner, the buffer access control circuit is used to update an address one by one, without the use of a delay circuit when consecutively accessing the upper and lower buffers.

2 Claims, 12 Drawing Sheets

MEMORY UNIT AND BUFFER ACCESS CONTROL CIRCUIT FOR UPDATING AN ADDRESS WHEN CONSECUTIVELY ACCESSING UPPER AND LOWER BUFFERS

BACKGROUND OF THE INVENTION

1. Field of the Invention

The present invention generally relates to buffer access control circuits which are used to access a buffer which is divided into an upper buffer and a lower buffer which are assigned the same address, and more particularly to a buffer access control circuit which uses a simple circuit construction to carry out a process of updating the address one by one when consecutively accessing the upper buffer and the lower buffer.

There exists a type of buffer which is divided into an upper buffer and a lower buffer which are assigned the same address. When consecutively accessing the upper buffer and the lower buffer of such a buffer, an access process is carried out by updating the address one by one and accessing data regions of the buffer indicated by the successively updated address. It is desirable that this access process can be realized by use of a simple circuit construction.

2. Description of the Related Art

The access process with respect to the buffer which is divided into the upper buffer and the lower buffer which are assigned the same address, includes a first access process with respect to the buffer formed by the upper buffer and the lower buffer, and a second access process with respect to the upper buffer and the lower buffer.

In the case of the second access process, the upper buffer may be specified again as the access destination after the upper buffer is accessed or, the lower buffer may be specified again as the access destination after the lower buffer is accessed. In this case, the access to the buffer is made without updating the address. On the other hand, in the first access process, when the lower buffer is specified as the access destination after the upper buffer is accessed or, when the upper buffer is specified as the access destination after the lower buffer is accessed, the access to the buffer is made by counting up the address by one.

A description will be given of an access to a 2-byte buffer 400 having a 1-byte upper buffer and a 401 1-byte lower buffer 402, by referring to FIGS. 1 through 4.

FIG. 1 shows a case where a write request is first issued to write a data A by specifying the lower buffer 402 as an access destination. In this case, the data A is written in the lower buffer 402 at a location ① specified by a present address, according to the algorithm described above. When a write request is then issued to write a data B by again specifying the lower buffer 402 as the access destination, the data B is written in the lower buffer 402 at the location ① according to the algorithm described above, thereby rewriting the previously written data A with the data B.

Similarly, FIG. 2 shows a case where a write request is first issued to write a data A by specifying the upper buffer 401 as an access destination. In this case, the data A is written in the upper buffer 401 at a location ② specified by a present address, according to the algorithm described above. When a write request is then issued to write a data B by again specifying the upper buffer 401 as the access destination, the data B is written in the upper buffer 401 at the location ② according to the algorithm described above, thereby rewriting the previously written data A with the data B.

On the other hand, FIG. 3 shows a case where a write request is first issued to write a data A by specifying the lower buffer 402 as an access destination. In this case, the data A is written in the lower buffer 402 at a location ① specified by a present address, according to the algorithm described above. When a write request is then issued to write a data B by specifying the upper buffer 401 as the access destination, the data B is written in the upper buffer 401 at the location ② according to the algorithm described above. Thereafter, the present address is counted up by one.

Next, when a write request is issued to write a data C by specifying the lower buffer 402 as the access destination, the data C is written in the lower buffer 402 at a location ③ specified by the updated present address, according to the algorithm described above. In addition, when a write request is then issued to write the data C by specifying the upper buffer 401 as the access destination, the data C is written in the upper buffer 401 at the location ④ specified by the updated present address, according to the algorithm described above.

Similarly, FIG. 4 shows a case where a write request is first issued to write a data A by specifying the upper buffer 401 as an access destination. In this case, the data A is written in the upper buffer 401 at the location ② specified by a present address, according to the algorithm described above. When a write request is then issued to write a data B by specifying the lower buffer 402 as the access destination, the data B is written in the lower buffer 401 at the location ① according to the algorithm described above. Thereafter, the present address is counted up by one.

Next, when a write request is issued to write a data C by specifying the upper buffer 401 as the access destination, the data C is written in the upper buffer 401 at the location ④ specified by the updated present address, according to the algorithm described above. In addition, when a write request is then issued to write the data C by specifying the lower buffer 402 as the access destination, the data C is written in the lower buffer 402 at the location ③ specified by the updated present address, according to the algorithm described above.

FIG. 5 is a system block diagram showing an example of a conventional buffer access control circuit which carries out the access process of the buffer 400 described above.

The buffer access control circuit shown in FIG. 5 includes D-type flip-flop circuits 100, 101 and 105, an AND circuit 102, a check signal generating circuit 103, an address counter (ADR. CTR.) circuit 104, and a delay circuit 106 which are connected as shown, with respect to the buffer 400. The flipflop 100 latches a power supply voltage Vcc at a falling edge of a lower buffer access signal LBA which has a low level when there is an instruction to access the lower buffer 402. The flip-flop circuit 101 latches the power supply voltage Vcc at a falling edge of an upper buffer access signal UBA which has a low level when there is an instruction to access the upper buffer 401. The AND circuit 102 obtains a logical product AND of data det-L and det-H latched by the flip-flop circuits 100 and 101. The check signal generating circuit 103 generates a check signal chk which has a low level when one of the lower buffer access signal LBA and the upper buffer access signal UBA has a low level. The address counter circuit 104 inputs an output signal andO of the AND circuit 102 at a rising edge of the check signal chk which is applied to the clock (CK) input of the address counter circuit 104, and counts up a counted value, which becomes the buffer address, when the output signal andO of the AND circuit 102 has a high level. The flip-flop (FF)

circuit 105 latches the output signal andO of the AND circuit 102 at the rising edge of the check signal chk, and outputs an inverted output signal. The delay circuit 106 delays the inverted output signal of the flip-flop circuit 105, and supplies a clear signal CL to clear terminals of the flip-flop circuits 100, 101 and 105. Each of the flip-flop circuits 100, 101 and 105 carries out a clear process at a rising edge of the clear signal CL input to the clear terminal thereof.

According to the buffer access control circuit having the construction shown in FIG. 5, when the lower buffer 402 is specified as the access destination and the upper buffer 401 is next specified as the access destination, the AND circuit 102 outputs a high-level signal and O at the falling edge of the upper buffer access signal UBA, as shown in a time chart of FIG. 6.

In response to this high-level output signal and O of the AND circuit 102, the address counter circuit 104 counts up the counted value by one at the rising edge of the check signal chk which rises at the rising edge of the upper buffer access signal UBA. In FIG. 6, ADR indicates the counted value of the address counter circuit 104. On the other hand, in response to the high-level output signal and O of the AND circuit 102, the inverted output signal of the flip-flop circuit 105 makes a transition from a high level to a low level at the rising edge of the check signal chk.

The delay circuit 106 delays the inverted output signal of the flip-flop circuit 105 by a delay time Δ, so as to output the clear signal CL which makes a transition to a low level after the delay time Δ from the rising edge of the upper buffer access signal UBA. Each of the flip-flop circuits 100, 101 and 105 clears the held signal from the high level to the low level in response to this clear signal CL.

Furthermore, the delay circuit 106 delays the inverted output signal of the flip-flop circuit 105 by the delay time Δ, so as to output the clear signal CL which makes a transition to a high level after the delay time Δ from the falling edge of the output signal andO of the AND circuit 102, thereby returning the buffer access control circuit to the state before the upper buffer access signal UBA was issued.

The time chart of FIG. 6 describes the case where the lower buffer 402 is specified as the access destination and the upper buffer 401 is next specified as the access destination. The operation of the circuit shown in FIG. 5 is similar to that described above in the case where the upper buffer 401 is specified as the access destination and the lower buffer 402 is next specified as the access destination. FIG. 7 is a time chart for this case where the upper buffer 401 is specified as the access destination and the lower buffer 402 is next specified as the access destination. In FIG. 7, those parts which are the same as those corresponding parts in FIG. 6 are designated by the same reference numerals, and a description thereof will be omitted.

Therefore, the conventional buffer access control circuit is provided with the flip-flop circuit 100 which carries out a latch operation using the lower buffer access signal LBA as a latch signal, the flip-flop circuit 101 which carries out a latch operation using the upper buffer access signal UBA as a latch signal, and the AND circuit 102 which obtains the logical product AND of the latched data det-L and det-H from the two flip-flop circuits 100 and 101. Every time a buffer access signal is issued, a reference is made to the output signal andO of the AND circuit 102 to detect whether or not the upper buffer 401 and the lower buffer 402 are consecutively specified as the access destination. In addition, when it is detected that the upper buffer 401 and the lower buffer 402 are consecutively specified as the access destination, the delay time Δ of the delay circuit 106 is used to clear the latched data det-L and det-H of the two flip-flop circuits 100 and 101 after this detection.

According to the conventional buffer access control circuit, the delay circuit 106 is essential to detect whether or not the upper buffer 401 and the lower buffer 402 are consecutively specified as the access destination.

In other words, the flip-flop circuits 100 and 101 carry out the latch operations when the upper buffer 401 and the lower buffer 402 are consecutively specified as the access destination, and when this is detected in synchronism with the check signal chk output from the check signal generating circuit 103, it is necessary to clear the latched data of the flip-flop circuits 100 and 101 in order to carry out the next detection.

The delay time Δ generated by the delay circuit 106 is used to carry out the clear process after the delay time Δ elapses from the time when it is detected that the two flip-flop circuits 100 and 101 have started the latch operations. This is the reason why the delay circuit 106 is essential.

However, when the delay circuit 106 is provided as in the conventional buffer access control circuit to realize the delay time Δ, there is a problem associated with variations in the delay time Δ in that an adjusting process becomes necessary.

In other words, if the delay time Δ is too small, the flip-flop circuits 100 and 101 will be cleared before the detection is made to determine whether or not the flip-flop circuits 100 and 101 have started the latch operations. On the other hand, if the delay time Δ is too large, the next buffer access signal will be issued before the latched data of the flip-flop circuits 100 and 101 are cleared.

SUMMARY OF THE INVENTION

Accordingly, it is a general object of the present invention to provide a novel and useful buffer access control circuit in which the problems described above are eliminated.

Another and more specific object of the present invention is to provide a buffer access control circuit which is used to access a buffer which is divided into an upper buffer and a lower buffer which are assigned the same address, and uses a simple circuit construction to carry out a process of updating the address one by one when consecutively accessing the upper buffer and the lower buffer.

Still another object of the present invention is to provide a buffer access control circuit for carrying out a process of updating an address one by one when consecutively accessing an upper buffer and a lower buffer as an access destination with respect to a buffer which is divided into the upper buffer and the lower buffer which are assigned the same address. In the buffer access control circuit, a detection circuit detects whether or not the upper buffer and the lower buffer are consecutively specified as the access destination, by storing levels when the upper buffer or the lower buffer is specified as the access destination, based on a corresponding relationship of a state where one of a high level and a low level is specified as the access destination and a state where the other of the high level and the low level is not specified as the access destination. A modifying circuit modifies a definition which prescribes the corresponding relationship to an opposite definition, when the detection circuit detects that the upper buffer and the lower buffer are consecutively specified as the access destination. According to the buffer access control circuit of the present invention, it is possible to carry out the process of updating the address one by one, without the use of a delay circuit which was essential in the conventional buffer access control circuit. For this reason, it is unnecessary to carry out a process of adjusting a delay time of the delay circuit, and the buffer access control circuit can be produced without the need for the delay time adjusting process.

A further object of the present invention is to provide a buffer access control circuit for carrying out a process of updating an address one by one when consecutively accessing an upper buffer and a lower buffer as an access destination with respect to a buffer which is divided into the upper buffer and the lower buffer which are assigned the same address. In the latter buffer access control circuit, a first latch circuit latches data in response to a lower buffer access signal for accessing the lower buffer and a second latch circuit latches the data in response to an upper buffer access signal for accessing the upper buffer. A detection circuit detects whether or not data latched by the first latch circuit and data latched by the second latch circuit match, and a modifying circuit inputs the data which indicates one of a high level and a low level to the first and second latch circuits, and modifies a level of the data to an inverted level when one of the upper and lower buffer access signals is generated and the detection circuit detects the match. According to the latter buffer access control circuit of the present invention, it is possible to carry out the process of updating the address one by one, without the use of a delay circuit which was essential in the conventional buffer access control circuit. For this reason, it is unnecessary to carry out a process of adjusting a delay time of the delay circuit, and the buffer access control circuit can be produced without the need for the delay time adjusting process.

Another object of the present invention is to provide a memory unit comprising a buffer divided into an upper buffer and a lower buffer which are assigned the same address, and a buffer access control circuit carrying out a process of updating an address one by one when consecutively accessing the upper buffer and the lower buffer as an access destination with respect to the buffer. In the buffer access control circuit, a detection circuit detects whether or not the upper buffer and the lower buffer are consecutively specified as the access destination, by storing levels when the upper buffer or the lower buffer is specified as the access destination, based on a corresponding relationship of a state where one of a high level and a low level is specified as the access destination and a state where the other of the high level and the low level is not specified as the access destination. A modifying circuit modifies a definition which prescribes the corresponding relationship to an opposite definition, when the detection circuit detects that the upper buffer and the lower buffer are consecutively specified as the access destination. According to the memory unit of the present invention, it is possible to carry out the process of updating the address one by one, without the use of a delay circuit which was essential in the conventional buffer access control circuit. For this reason, it is unnecessary to carry out a process of adjusting a delay time of the delay circuit, and the buffer access control circuit can be produced without the need for the delay time adjusting process.

Still another object of the present invention is to provide a memory unit comprising a buffer divided into an upper buffer and a lower buffer which are assigned the same address, and a buffer access control circuit carrying out a process of updating an address one by one when consecutively accessing the upper buffer and the lower buffer as an access destination with respect to the buffer. In the buffer access control circuit, a first latch circuit latches data in response to a lower buffer access signal for accessing the lower buffer and a second latch circuit latches the data in response to an upper buffer access signal for accessing the upper buffer. A detection circuit detects whether or not data latched by the first latch circuit and data latched by the second latch circuit match. A modifying circuit inputs the data which indicates one of a high level and a low level to the first and second latch circuits and modifies a level of the data to an inverted level when one of the upper and lower buffer access signals is generated and the detection circuit detects the match. According to the latter memory unit of the present invention, it is possible to carry out the process of updating the address one by one, without the use of a delay circuit which was essential in the conventional buffer access control circuit. For this reason, it is unnecessary to carry out a process of adjusting a delay time of the delay circuit, and the buffer access control circuit can be produced without the need for the delay time adjusting process.

BRIEF DESCRIPTION OF THE DRAWINGS

Other objects and further features of the present invention will be apparent from the following detailed description when read in conjunction with the accompanying drawings in which.

DESCRIPTION OF THE PREFERRED EMBODIMENTS

First, a description will be given of the operating principle a buffer access control circuit of the present invention, by referring to FIG. 8.

Figure 1:
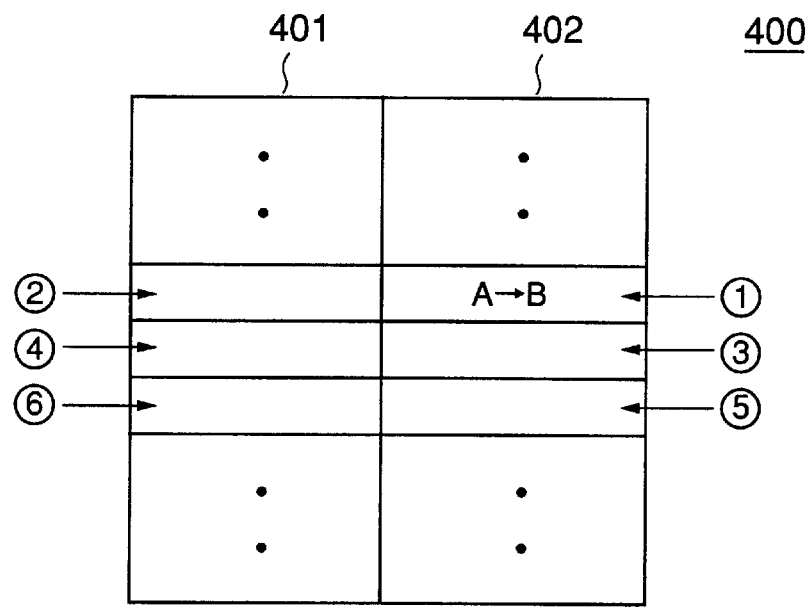
FIG. 1 illustrates issuing a write request to write a data A and a data B by specifying a lower buffer access destination.
Figure 2:
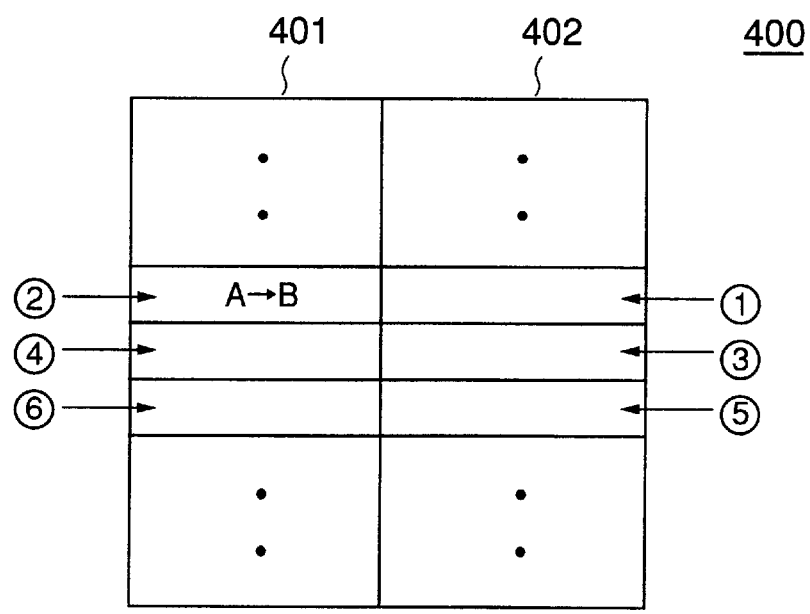
FIG. 2 illustrates issuing a write request to write a data A and a data B by specifying an upper buffer access destination.
Figure 3:
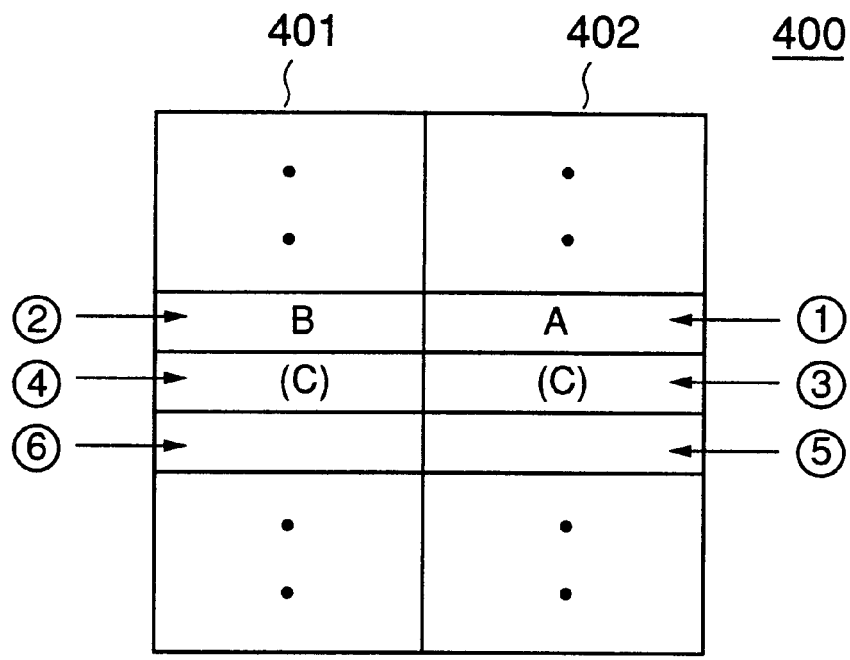
FIG. 3 illustrates issuing write requests to write a data A and a data B by specifying a lower buffer and an upper buffer, respectively, as access destinations, and then issuing a write request to write a data C by specifying the lower buffer as an access destination.
Figure 4:
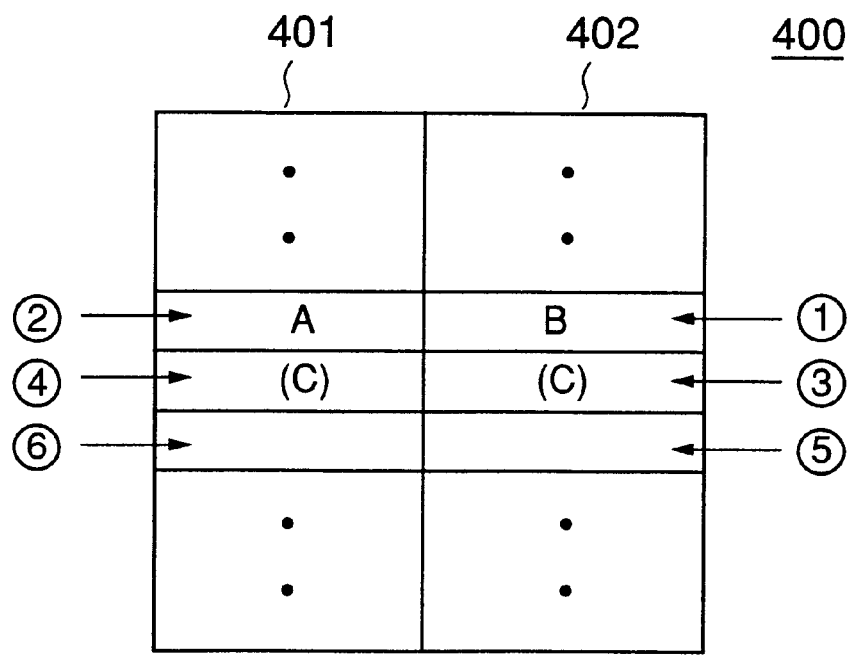
FIG. 4 illustrates issuing write requests to write a data A and a data B by specifying an upper buffer and a lower buffer, respectively, as access destinations, and then writing a data C by specifying the upper buffer as an access destination.
Figure 5:
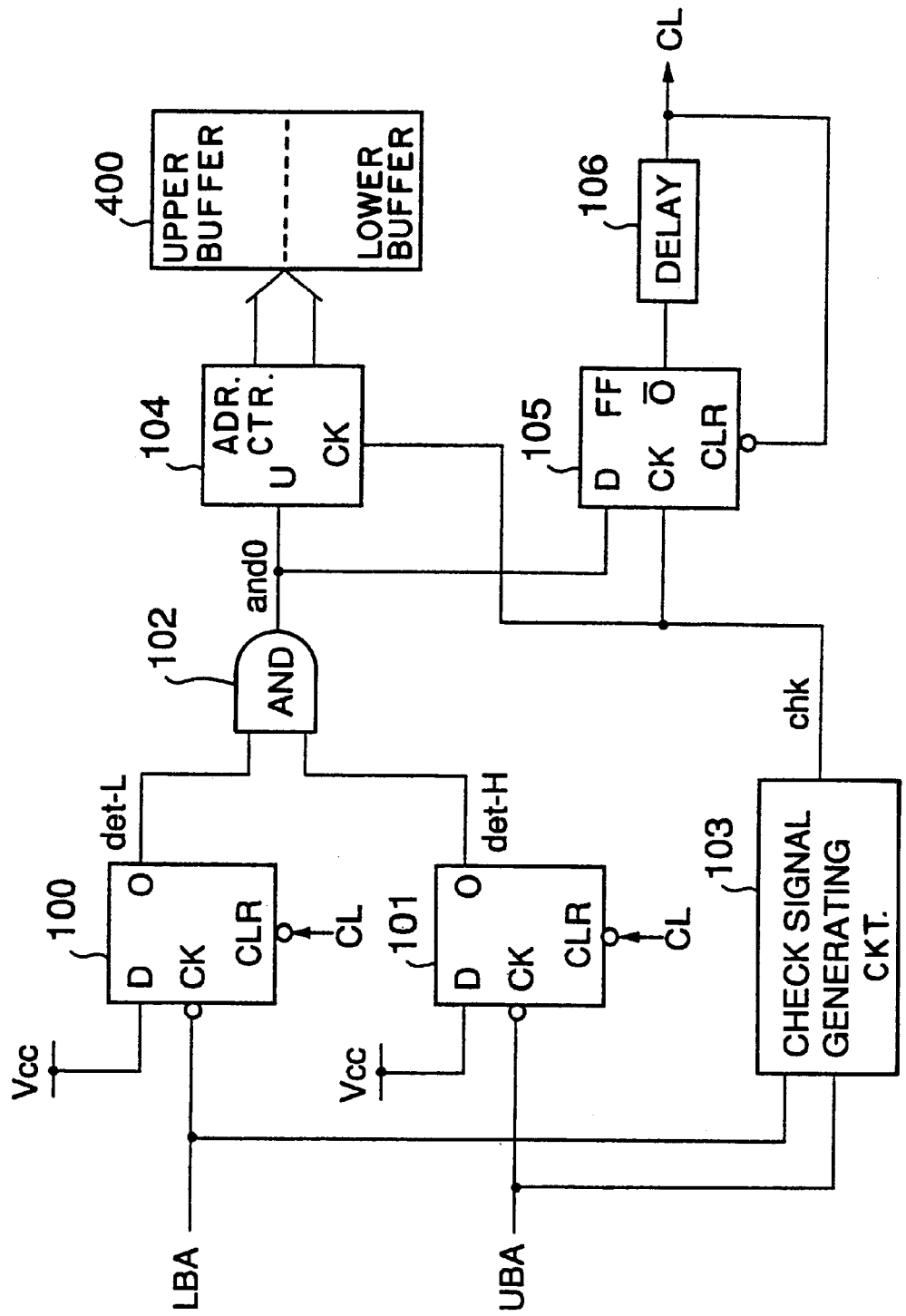
FIG. 5 is a system block diagram showing an example of a conventional buffer access control circuit.
Figure 6:
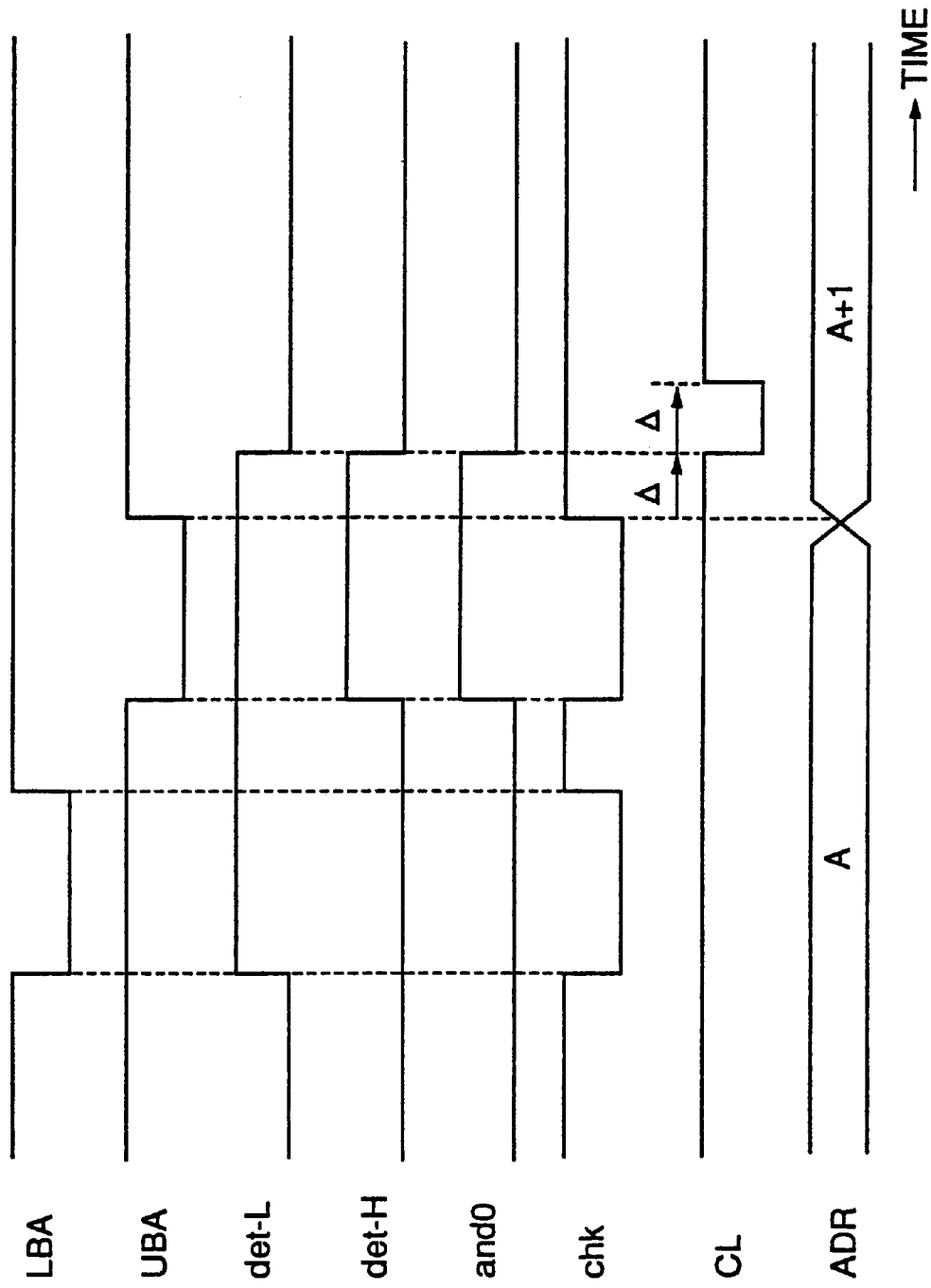
FIG. 6 is a time chart for explaining the operation of the conventional buffer access control circuit where a lower buffer is first specified as an access destination and an upper buffer is next specified as the access destination.
Figure 7:
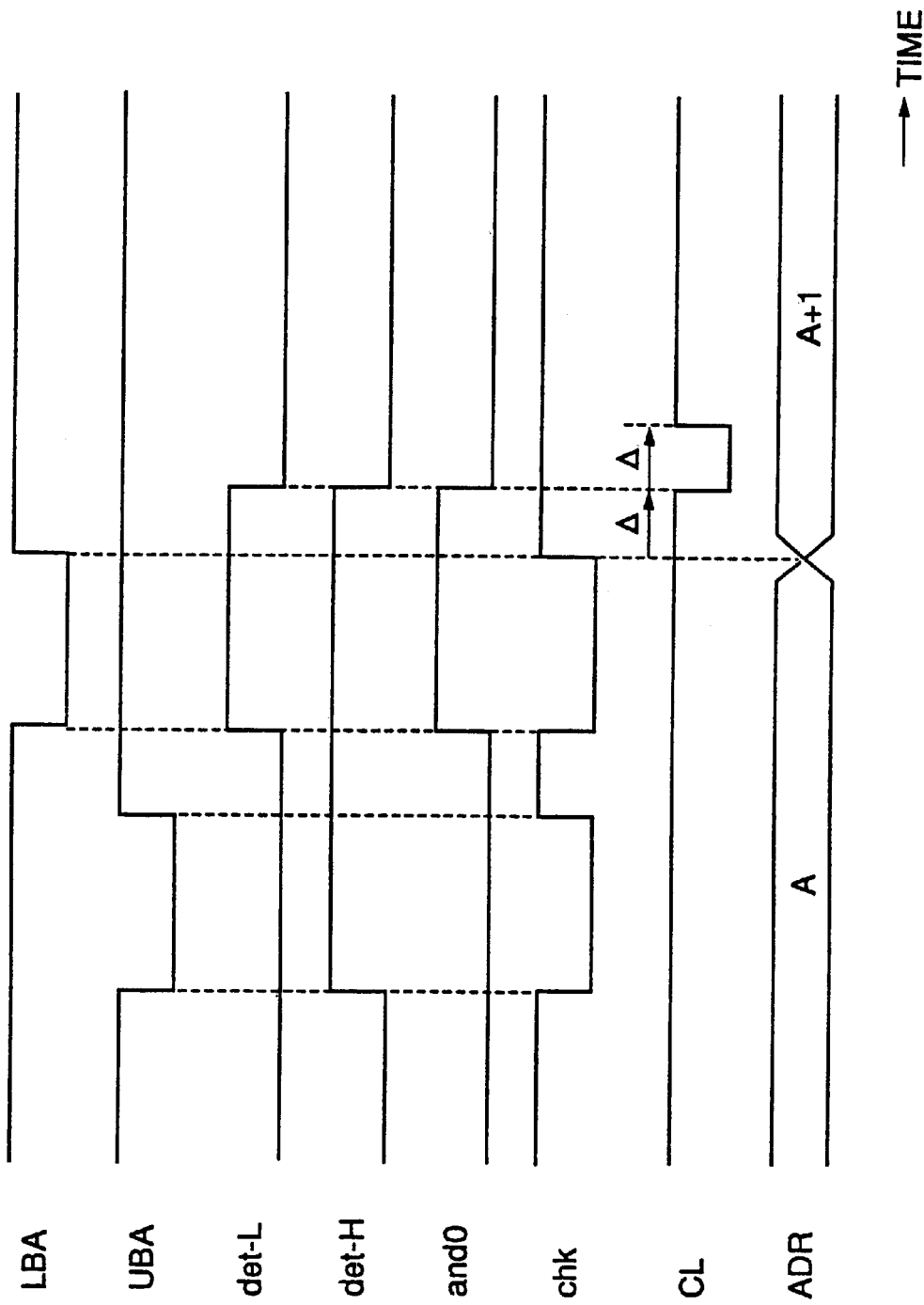
FIG. 7 is a time chart for explaining the operation of the conventional buffer access control circuit where an upper buffer is first specified as an access destination and a lower buffer is next specified as the access destination.
Figure 8:
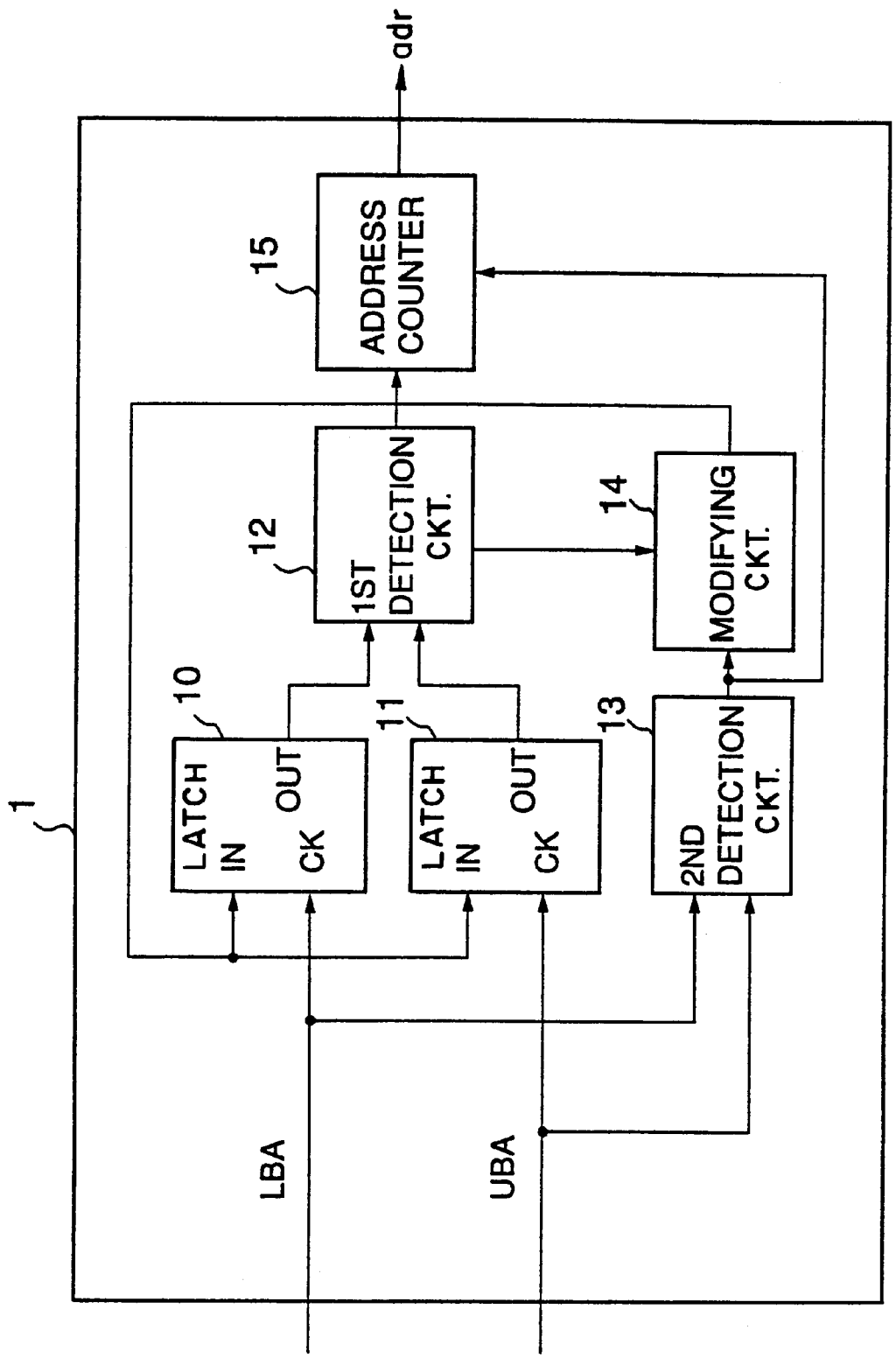
FIG. 8 is a system block diagram for explaining a buffer access control circuit of the present invention.

A buffer access control circuit 1 according to the present invention shown in FIG. 8 controls access to a buffer which is divided into an upper buffer and a lower buffer which are assigned the same address. When the upper buffer and the lower buffer are accessed consecutively, the buffer access control circuit 1 carries out a process of updating the address one by one.

The buffer access control circuit 1 includes a first latch circuit 10, a second latch circuit 11, a first detection circuit 12, a second detection circuit 13, a modifying circuit 14, and an address counter circuit 15 which are connected as shown in FIG. 8.

The first latch circuit 10 latches a data input to an input terminal IN thereof, in response to a lower buffer access signal LBA which is input to a clock terminal CK of the first latch circuit 10. The second latch circuit 11 latches the data input to an input terminal IN thereof, in response to an upper buffer access signal UBA which is input to a clock terminal CK of the second latch circuit 11. The data input to the second latch circuit 11 is the same as the data input to the first latch circuit 10.

The first detection circuit 12 detects whether or not the latched data from the first latch circuit 10 and the latched data from the second latch circuit 11 match. The second detection circuit 13 detects the lower buffer access signal LBA when the lower buffer access signal LBA is generated, and detects the upper buffer access signal UBA when the upper buffer access signal UBA is generated.

The modifying circuit 14 outputs a data having a high level or a low level to the input terminals IN of the first and second latch circuits 10 and 11. When the second detection circuit 13 detects the generation of the buffer access signal, the modifying circuit 14 modifies the data which is input to the first and second latch circuits 10 and 11 into a data having an inverted level if the first detection circuit 12 detects that the two latched data from the first and second latch circuits 10 and 11 match.

The address counter circuit 15 generates a buffer address by updating a counted value, which becomes the buffer address, one by one, if the first detection circuit 12 detects that the two latched data from the first and second latch circuits 10 and 11 match when the second detection circuit 13 detects the generation of a buffer access signal.

In this buffer access control circuit 1, the modifying circuit 14 outputs, as an initial value, for example, a high level signal to the input terminals IN of the first and second latch circuits 10 and 11. Hence, the first latch circuit 10 latches the high-level signal when the lower buffer access signal LBA is issued, and the second latch circuit 11 latches the high-level signal when the upper buffer access signal UBA is issued.

When the upper buffer and the lower buffer are consecutively accessed, and the first latch circuit 10 latches the high-level signal and the second latch circuit 11 latches the high-level signal, the first detection circuit 12 outputs a signal which indicates that the latched data from the first and second latch circuit 10 and 11 match.

Meanwhile, the second detection circuit 13 detects the lower buffer access signal LBA when the lower buffer access signal LBA is generated, detects the upper buffer access signal UBA when the upper buffer access signal UBA is generated, and outputs a detection signal. Responsive to this detection signal, the address counter circuit 15 judges that the upper buffer and the lower buffer are consecutively accessed if the first detection circuit 12 detects that the two latched data from the first and second latch circuits 10 and 11 match, and updates the counted value which becomes the buffer address by one. In addition, responsive to the detection signal from the second detection circuit 13, the modifying circuit 14 judges that the upper buffer and the lower buffer are consecutively accessed if the first detection circuit 12 detects that the latched data from the first and second latch circuits 10 and 11 match, and modifies the signal level output to the input terminals IN of the first and second latch circuit 10 and 11 from the high level to the low level.

By this modification process, the first latch circuit 10 then latches the low-level data when the lower buffer access signal LBA is issued, and the second latch circuit 11 then latches the low-level data when the upper buffer access signal UBA is issued. As a result, the first detection circuit 12 outputs a signal which indicates that the latched data from the first and second latch circuits 10 and 11 match, when the upper buffer and the lower buffer are consecutively accessed.

Thereafter, responsive to the detection signal output from the second detection circuit 13, the address counter circuit 15 judges that the upper buffer and the lower buffer are consecutively accessed if the first detection circuit 12 detects that the two latched data from the first and second latch circuits 10 and 11 match, and updates the counted value which becomes the buffer address by one. In addition, responsive to the detection signal from the second detection circuit 13, the modifying circuit 14 judges that the upper buffer and the lower buffer are consecutively accessed if the first detection circuit 12 detects that the latched data from the first and second latch circuits 10 and 11 match, and modifies the signal level output to the input terminals IN of the first and second latch circuit 10 and 11 from the low level to the high level.

Therefore, according to the buffer access control circuit 1 of the present invention, when the buffer is divided into the upper buffer and the lower buffer which are assigned the same address, and the upper buffer and the lower buffer are consecutively accessed as the access destination, it is possible to carry out the process of updating the address one by one, without the need to use a delay circuit as was necessary in the case of the conventional buffer access control circuit described above.

Figure 9:
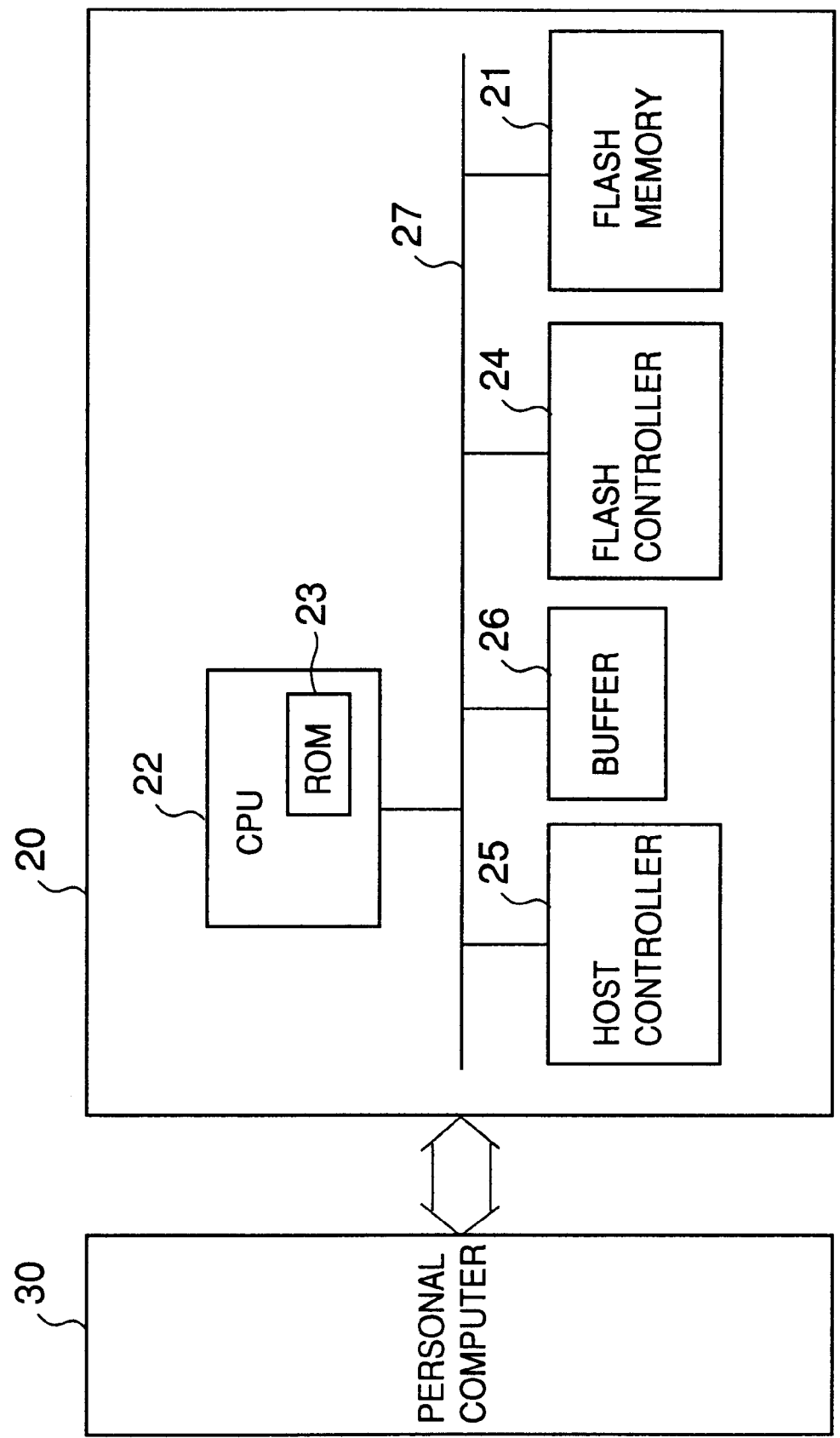
FIG. 9 is a system block diagram showing the circuit construction of a memory card.

Next, a description will be given of an embodiment of the buffer access control circuit according to the present invention. FIG. 9 is a system block diagram showing the circuit construction of a memory card 20 which may be applied with this embodiment of the buffer access control circuit.

As shown in FIG. 9, the memory card 20 applied with the present invention includes a flash memory 21, for example, and carries out an access process with respect to this flash memory 21 in response to an access request issued from a personal computer 30. In order to realize this access process, the memory card 20 further includes, in addition to the flash memory 21, a Central Processing Unit (CPU) 22 which has a Read Only Memory (ROM)] 23, a flash controller 24, a host controller 25, a buffer 26 and a bus 27 which are connected as shown in FIG. 9.

The ROM 23 stores a program for realizing the access to the flash memory 21. When the personal computer 30 issues the access request, the CPU 22 issues an access instruction with respect to the flash controller 24 according to this program, and carries out the access process with respect to the flash memory 21.

When the access instruction is issued from the CPU 22, the flash controller 24 acquires the right to use the bus 27, and issues a memory control command with respect to the flash memory 21, so as to access the flash memory 21. The buffer 26 stores data to be written into the flash memory 21, and data read from the flash memory 21. The host controller 25 carries out an interface process between the personal computer 30 and the memory card 20.

Figure 10:
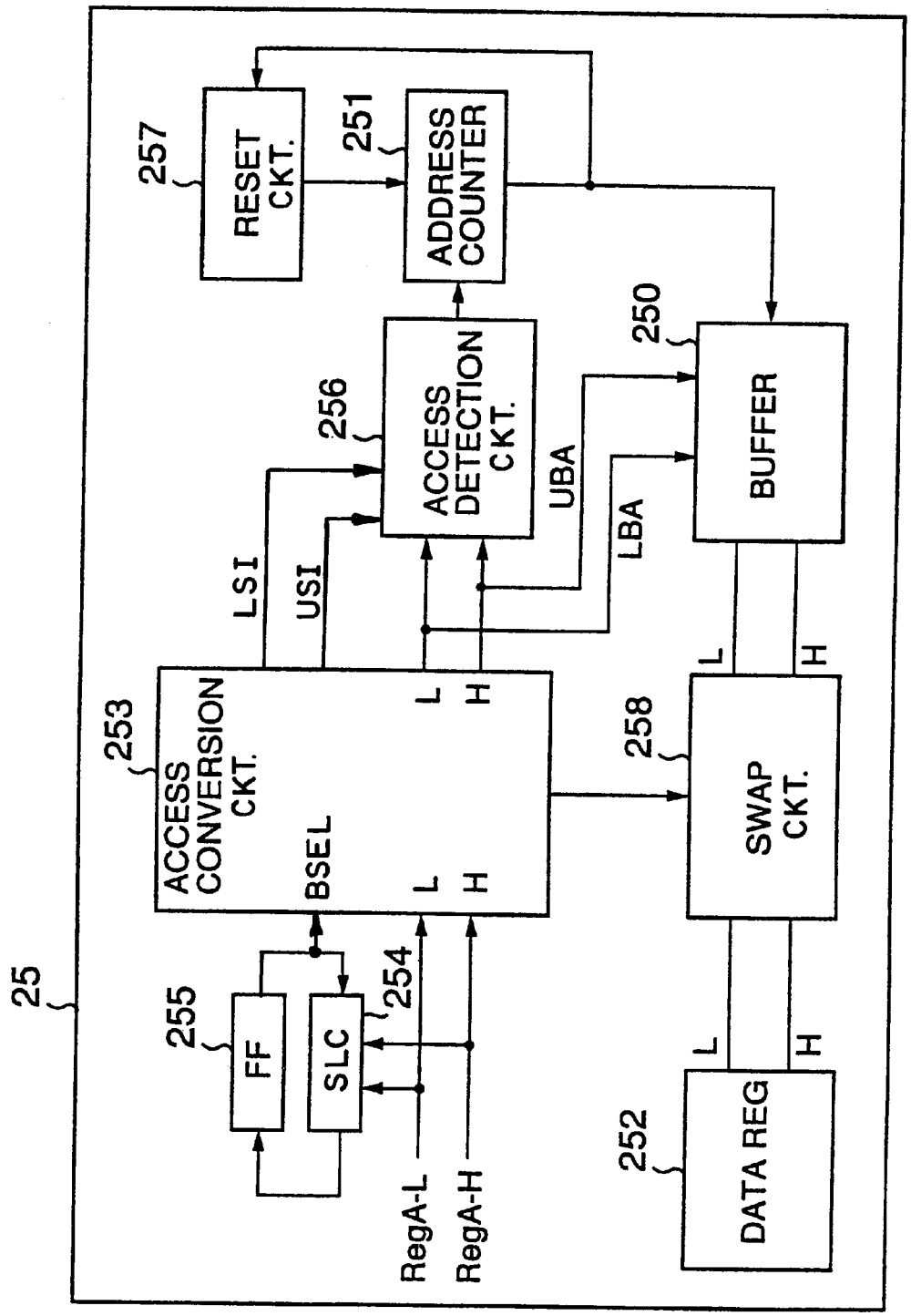
FIG. 10 is a system block diagram showing the circuit construction of a host controller.

FIG. 10 is a system block diagram showing the circuit construction of the host controller 25.

The host controller 25 includes a buffer 250, an address counter circuit 251, a data register 252, an access conversion circuit 253, a swap logic circuit 254, a flip-flop circuit 255, an access detection circuit 256, a reset circuit 257, and a swap circuit 258 which are connected as shown in FIG. 10.

The buffer 250 stores data exchanged between the host controller 25 and the personal computer 30, and between the host controller 25 and the flash controller 24. This buffer 250 is divided into an upper buffer and a lower buffer.

The access process with respect to the buffer 250 includes a first access process which accesses the pair formed by the upper buffer and the lower buffer, and a second access process which accesses the upper buffer and the lower buffer.

As described above in conjunction with FIGS. 1 through 4, in the second access process, the upper buffer may be specified again as the access destination after the upper buffer is accessed or, the lower buffer may be specified again as the access destination after the lower buffer is accessed. In this case, the access to the buffer 250 is made without updating the address. On the other hand, in the first access process, when the lower buffer is specified as the access destination after the upper buffer is accessed or, when the upper buffer is specified as the access destination after the lower buffer is accessed, the access to the buffer 250 is made by counting up the address by one.

The address counter circuit 251 counts up the counted value from an initial value, and generates the address of the buffer 250. The data register 252 stores the data to be written into the buffer 250 and the data read from the buffer 250.

The access conversion circuit 253 carries out a swap process in which a second lower buffer access signal is converted into an upper buffer access signal when the lower buffer access signal issued from the personal computer 30 continues. In other words, if the lower buffer access signal LBA continues as "LBA→LBA→LBA→LBA→LBA→. . .", the access conversion circuit 253 makes a conversion to "LBA→UBA→LBA→UBA→LBA→. . .", UBA denotes the upper buffer access signal.

The personal computer 30 accesses the buffer 250 via a register which becomes a window for the buffer 250. Hence, the buffer access signals input to the access conversion circuit 253 from the personal computer 30 are in a sense register access signals RegA-L and RegA-H.

The access conversion circuit 253 is provided with a function of not swapping the register access signals RegA-L and RegA-H issued from the personal computer 30 when instructed from the personal computer 30 not to carry out a swap process, so that the access conversion circuit 253 outputs the buffer access signals as they are.

The swap logic circuit 254 determines whether or not to convert the lower buffer access signal LBA into the upper buffer access signal UBA, based on the data held in the flip-flop circuit 255, which holds the previous determination result, and the buffer access signals (register access signals) RegA-L and RegA-H issued from the personal computer 30. The determination result of the swap logic circuit 254 is input to the access conversion circuit 253 via the flip-flop circuit 255.

The access detection circuit 256 carries out the access process described above to carry out the access by counting up the buffer address by one when the lower buffer is specified as the access destination in succession to the upper buffer or, when the upper buffer is specified as the access destination in succession to the lower buffer. The access detection circuit 256 carries out a process of updating the counted value of the address counter circuit 251 in response to the buffer access signals output from the access conversion circuit 253.

The reset circuit 257 carries out a process of resetting the counted value of the address counter circuit 251. The swap circuit 258 carries out a process of swapping the data of the lower buffer and the data of the upper buffer which are exchanged between the buffer 250 and the data register 252, in correspondence with the swap process of the access conversion circuit 253.

Figure 11:
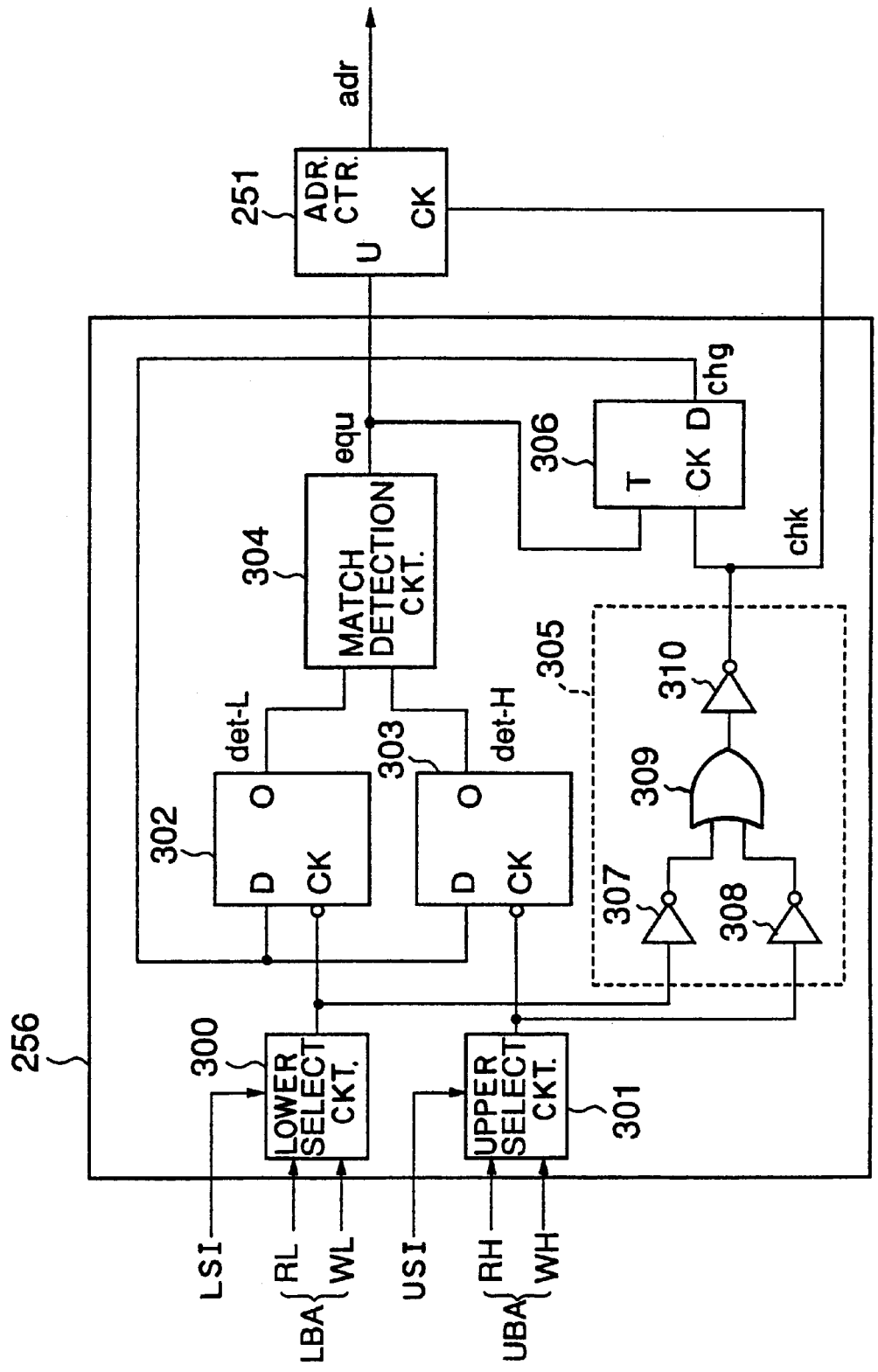
FIG. 11 is a system block diagram showing an embodiment of an access detection circuit.

FIG. 11 is a system block diagram showing an embodiment of the access detection circuit 256.

The access detection circuit 256 includes a lower selection circuit 300, an upper selection circuit 301, a lower D-type flip-flop circuit 302, an upper D-type flip-flop circuit 303, a match detection circuit 304, a check signal generating circuit 305, and a toggle circuit 306 which are connected as shown in FIG. 11.

The lower selection circuit 300 inputs a lower buffer read signal RL and a lower buffer write signal WL which are output from the access conversion circuit 253, and selectively outputs one of the signals RL and WL depending on a select instruction signal from the access conversion circuit 253. The upper selection circuit 301 inputs an upper buffer read signal RH and an upper buffer write signal WH which are output from the access conversion circuit 253, and selectively outputs one of the signals RH and WH depending on a select instruction signal from the access conversion circuit 253.

For the sake of convenience, the signal output from the lower selection circuit 300 will be referred to as a lower buffer access signal, and the signal output from the upper selection circuit 301 will be referred to as an upper buffer access signal. In addition, it is assumed for the sake of convenience that the lower buffer access signal has a low level when an access instruction to the lower buffer exists, and that the upper buffer access signal has a low level when an access instruction to the upper buffer exists.

The lower D-type flip-flop circuit 302 latches an output signal of the toggle circuit 306 at a falling edge of the lower buffer access signal which is output from the lower selection circuit 300. The upper D-type flip-flop circuit 303 latches the output signal of the toggle circuit 306 at a falling edge of the upper buffer access signal which is output from the upper selection circuit 301.

The match detection circuit 304 detects whether or not a latched data det-L from the lower D-type flip-flop circuit 302 and a latched data det-H from the upper D-type flip-flop circuit 303 match. The match detection circuit 304 outputs a high-level detection signal equ when a match is detected.

The check signal generating circuit 305 outputs a low-level check signal chk when one of the lower buffer access signal output from the lower selection circuit 300 and the upper buffer access signal output from the upper selection circuit 301 has a low level.

The check signal generating circuit 305 includes, for example, inverter circuits 307, 308 and 310, and an OR circuit 309 which are connected as shown in FIG. 11. The inverter circuit 307 inverts the lower buffer access signal output from the lower selection circuit 300. The inverter circuit 308 inverts the upper buffer access signal output from the upper selection circuit 301. The OR circuit 309 obtains a logical OR of output signals of the inverter circuits 307 and 308. The inverter circuit 310 inverts an output signal of the OR circuit 309, and outputs the check signal chk.

The toggle circuit 306 is made up of a flip-flop circuit. The toggle circuit 306 samples the output signal equ of the match detection circuit 304 at a rising edge of the check signal chk which is output from the check signal generating circuit 305. When the output signal equ of the match detection circuit 304 has a high level, that is, when the latched data det-L from the lower D-type flip-flop circuit 302 and the latched data det-H from the upper D-type flip-flop circuit 303 match, the toggle circuit 306 inverts the level of the signal edu and outputs a hold signal chg which is input to input terminals D of the lower D-type flip-flop circuit 302 and the upper D-type flip-flop circuit 303.

Although not described with reference to FIG. 10, the address counter 251 samples the output signal equ of the match detection circuit 304 at a rising edge of the check signal chk which is output from the check signal generating circuit 305. When the signal equ has a high level, that is, when the latched data det-L from the lower D-type flip-flop circuit 302 and the latched data det-H from the upper D-type flip-flop circuit 303 match, the address counter circuit 251 carries out a process of counting up the counted value by one.

Figure 12:
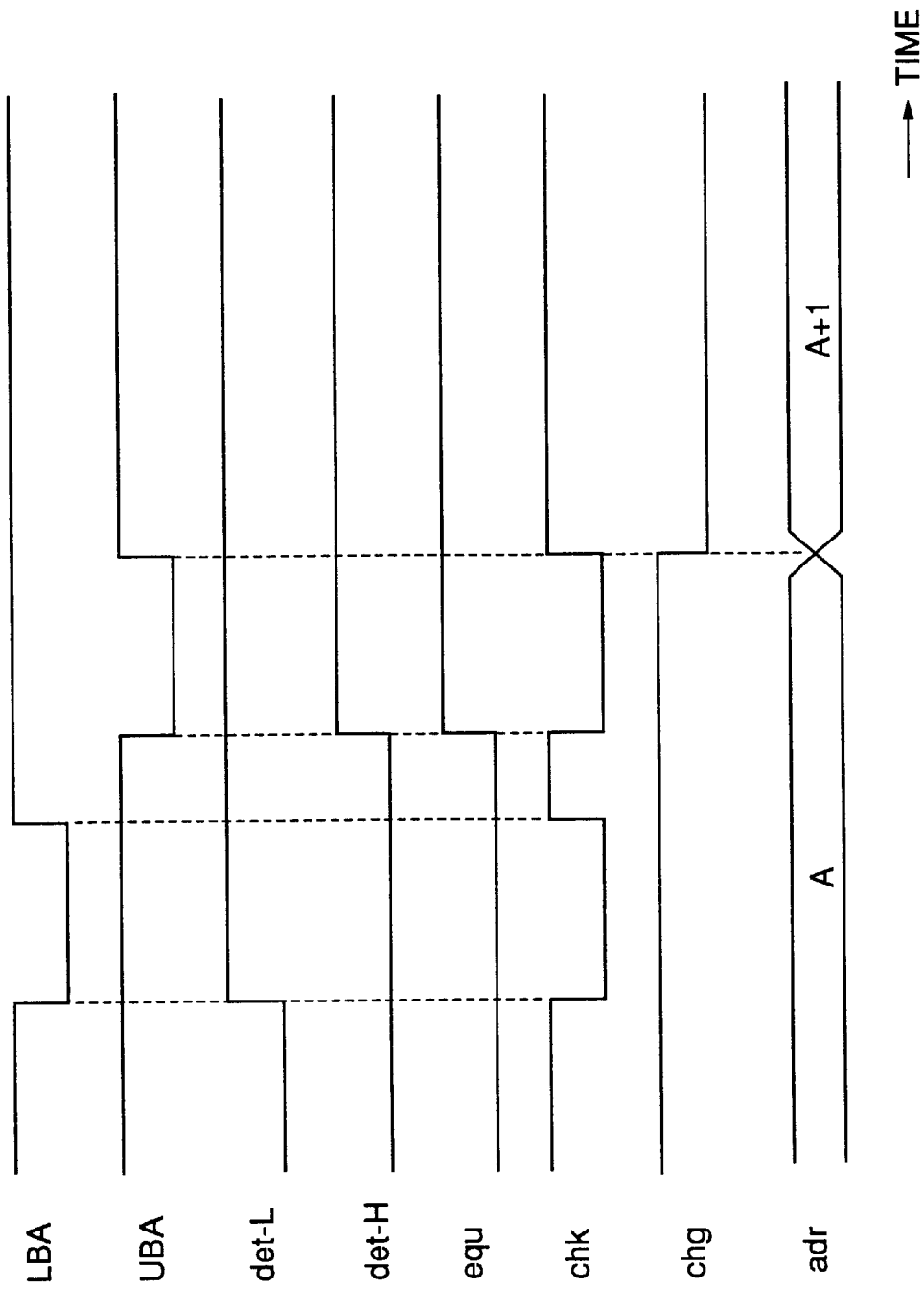
FIG. 12 is a time chart for explaining the operation of the access detection circuit.
Figure 13:
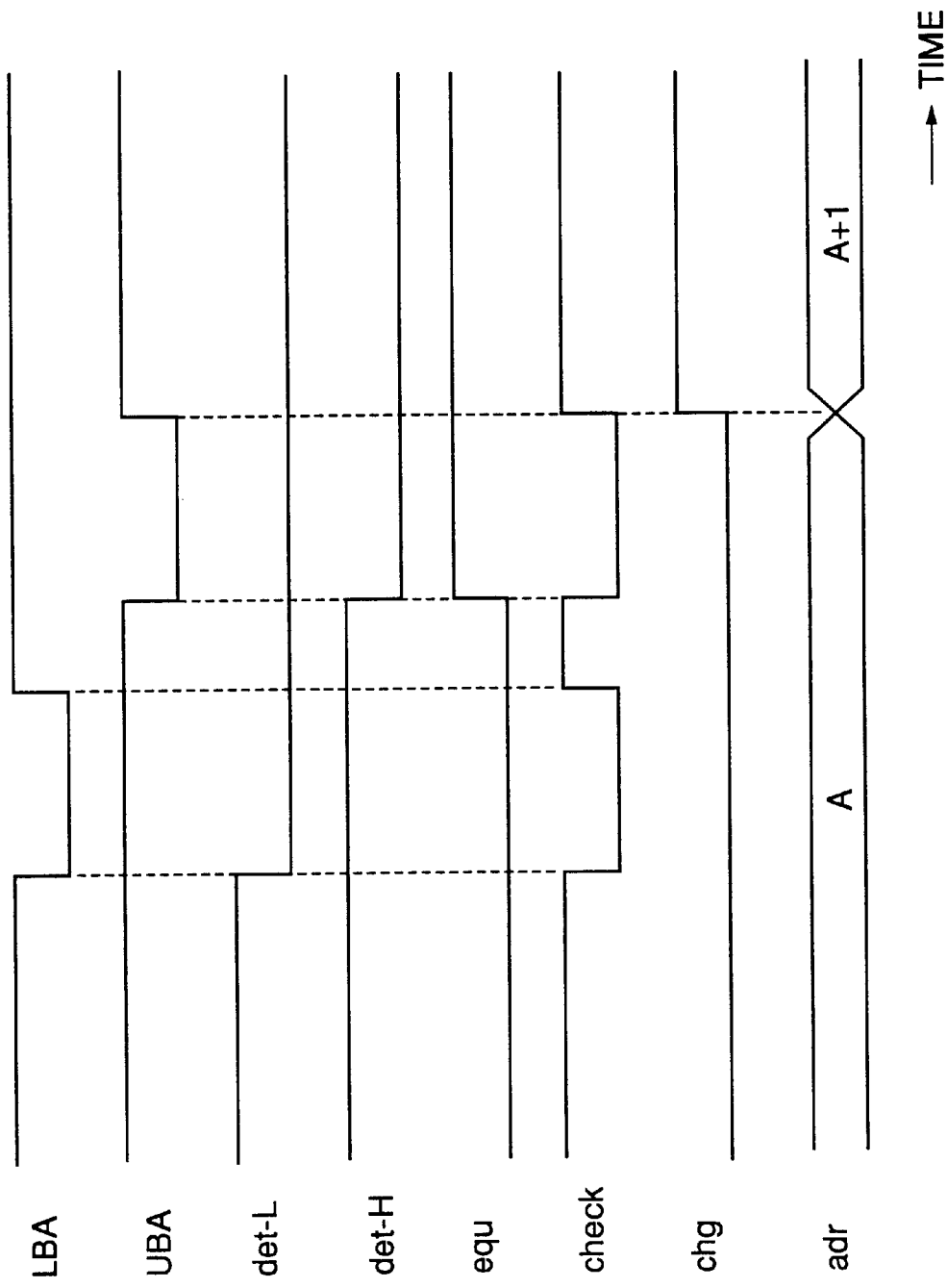
FIG. 13 is a time chart for explaining the operation of the access detection circuit.

Next, a description will be given of the operation of the access detection circuit 256, by referring to FIGS. 12 and 13. FIGS. 12 and 13 are time charts for explaining the operation of the access detection circuit 256. In FIGS. 12 and 13, the same signal designations are used as in FIG. 11. In addition, adr denotes the counted value of the address counter circuit 251.

In the initial state, the toggle circuit 306 outputs a high-level hold signal chg to the input terminals D of the lower D-type flip-flop circuit 302 and the upper D-type flip-flop circuit 303.

In this state, when the lower buffer access signal LBA is issued from the access conversion circuit 253, the lower D-type flip-flop circuit 302 latches the hold signal output from the toggle circuit 306 at a falling edge of the lower buffer access signal LBA. Hence, as shown in FIG. 12, the lower D-type flip-flop circuit 302 latches a high-level signal det-L.

Further, in this state, when the upper buffer access signal UBA is issued from the access conversion circuit 253, the upper D-type flip-flop circuit 303 latches the hold signal output from the toggle circuit 306 at a falling edge of the upper buffer access signal UBA. Thus, as shown in FIG. 12, the upper D-type flip-flop circuit 303 latches a high-level signal det-H.

Thereafter, when the upper buffer access signal UBA is issued in succession to the lower buffer access signal LBA, or when the lower buffer access signal LBA is issued in succession to the upper buffer access signal UBA, both the lower D-type flip-flop circuit 302 and the upper D-type flip-flop circuit 303 output high-level signals. For this reason, the match detection circuit 304 detects the match of the latched data from the two flip-flop circuits 302 and 303, and outputs a high-level signal equ as shown in FIG. 12.

On the other hand, the check signal generating circuit 305 outputs a low-level check signal chk as shown in FIG. 12 when the lower buffer access signal LBA is issued from the access conversion circuit 253 and when the upper buffer access signal UBA is issued from the access conversion circuit 253.

Responsive to this check signal chk, the address counter circuit 251 samples the output signal equ of the match detection circuit 304 by a rising edge of the check signal chk, and carries out a process of counting up the counted value adr as shown in FIG. 12 when the high level of the signal equ is detected.

Accordingly, when the upper buffer access signal UBA is issued in succession to the lower buffer access signal LBA, or when the lower buffer access signal LBA is issued in succession to the upper buffer access signal UBA, the address counter circuit 251 carries out the process of counting up the counted value adr by one. This counted value adr becomes the address of the buffer 250.

On the other hand, responsive to the check signal chk, the toggle circuit 306 samples the output signal equ of the match detection circuit 304 at a rising edge of the check signal chk, and modifies the signal level of the hold signal output up to that point in time from the high level to the low level, when the high level of the signal equ is detected. Hence, as indicated by chg in FIG. 12, a low-level hold signal is input to the input terminals D of the lower D-type flip-flop circuit 302 and the upper D-type flip-flop circuit 303.

In this state, when the lower buffer access signal LBA is issued from the access conversion circuit 253, the lower D-type flip-flop circuit 302 latches the output signal chg of the toggle circuit 306 at a falling edge of the lower buffer access signal LBA. Hence, as shown in FIG. 13, the lower D-type flip-flop circuit 302 latches a low-level signal det-L.

Furthermore, when the upper buffer access signal UBA is issued from the access conversion circuit 253 in this state, the upper D-type flipflop circuit 303 latches the output signal chg of the toggle circuit 306 at a falling edge of the upper buffer access signal UBA. Thus; as shown in FIG. 13, the upper D-type flip-flop circuit 303 latches a low-level signal det-H.

Thereafter, when the upper buffer access signal UBA is issued in succession to the lower buffer access signal LBA, or when the lower buffer access signal LBA is issued in succession to the upper buffer access signal UBA, both the lower D-type flip-flop circuit 302 and the upper D-type flip-flop circuit 303 output low-level signals. For this reason, the match detection circuit 304 detects the match of the latched data from the two flip-flop circuits 302 and 303, and outputs a high-level signal equ as shown in FIG. 13.

On the other hand, the check signal generating circuit 305 outputs a low-level check signal chk as shown in FIG. 13 when the lower buffer access signal LBA is issued from the access conversion circuit 253 and when the upper buffer access signal UBA is issued from the access conversion circuit 253.

Responsive to this check signal chk, the address counter circuit 251 samples the output signal equ of the match detection circuit 304 by a rising edge of the check signal chk, and carries out a process of counting up the counted value adr as shown in FIG. 13 when the high level of the signal equ is detected.

Accordingly, after the upper buffer access signal UBA is issued in succession to the lower buffer access signal LBA, or after the lower buffer access signal LBA is issued in succession to the upper buffer access signal UBA, the address counter circuit 251 carries out the process of counting up the counted value adr by one upon a next successive occurrence of UBA and LBA or a next successive occurrence of LBA and UBA, even if no clear process is carried out by the lower D-type flip-flop circuit 302 and the upper D-type flip-flop circuit 303.

On the other hand, responsive to the check signal chk, the toggle circuit 306 samples the output signal equ of the match detection circuit 304 at a rising edge of the check signal chk, and modifies the signal level of the hold signal from the low level to the high level, when the high level of the signal equ is detected. Hence, as indicated by chg in FIG. 13, a high-level hold signal is input to the input terminals D of the lower D-type flip-flop circuit 302 and the upper D-type flip-flop circuit 303.

By thereafter repeating processes similar to the above, when the upper buffer access signal UBA is issued in succession to the lower buffer access signal LBA, or when the lower buffer access signal LBA is issued in succession from the access conversion circuit 253, to the upper buffer access signal UBA, the access detection circuit 256 carries out the process of counting up the counted value of the address counter circuit 251 by one, without clearing the lower D-type flip-flop circuit 302 and the upper D-type flip-flop circuit 303.

The reset circuit 257 shown in FIG. 10 carries out a reset process to reset the counted value of the address counter circuit 251 which counts up the counted value in the above described manner.

Figure 14:
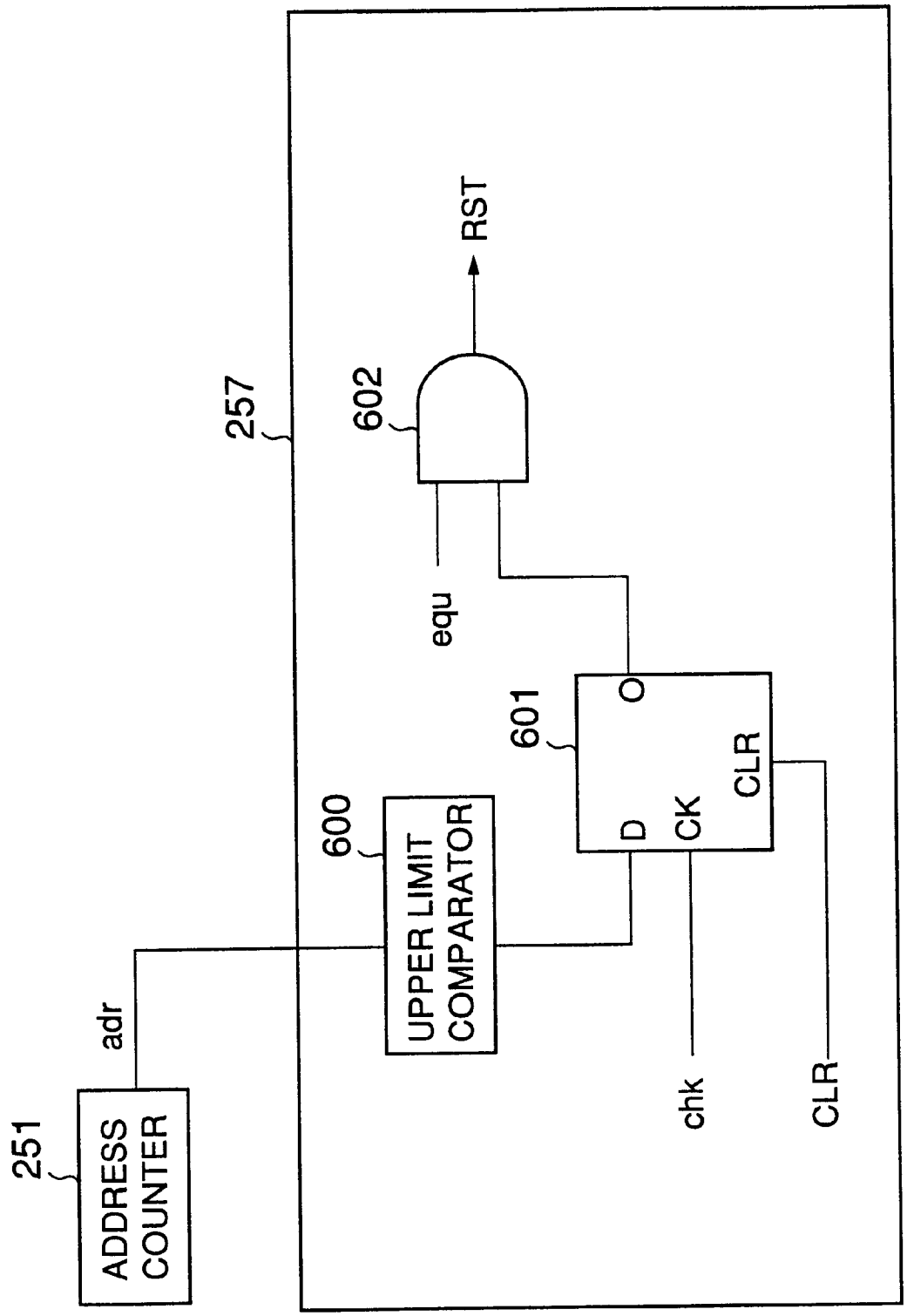
FIG. 14 is a system block diagram showing an embodiment of a reset circuit.

FIG. 14 is a system block diagram showing an embodiment of the reset circuit 257.

The reset circuit 257 includes an upper limit comparator circuit 600, a D-type flip-flop circuit 601, and an AND circuit 602 which are connected as shown in FIG. 14. The upper limit comparator circuit 600 compares the counted value adr output from the address counter circuit 251 and an upper limit value, and outputs a high-level signal when the upper limit value is exceeded. The D-type flip-flop circuit 601 samples the output signal of the upper limit comparator circuit 600 at a rising edge of the check signal chk which is output from the check signal generating circuit 305, and is initialized by a clear signal CLR. The AND circuit 602 generates a reset signal RST by obtaining a logical product AND of the output signal of the D-type flip-flop circuit 601 and the output signal equ of the match detection circuit 304.

According to the reset circuit 257 having the construction shown in FIG. 14, if it is assumed for the sake of convenience that the upper limit value of the counted value adr of the address counter circuit 251 is "100", for example, the upper limit comparator circuit 600 outputs a high-level signal when the counted value adr of the address counter circuit 251 becomes "101".

The D-type flip-flop circuit 601 latches the high-level signal which is output from the upper limit comparator circuit 600 at the rising edge of the check signal chk which is output from the check signal generating circuit 305 (See FIG. 11) when the counted value adr of the address counter circuit 251 is counted up to "101". The match detection circuit 304 outputs a high-level signal equ by the match of signals det-L and det-H, indicating the succession of the upper buffer access signal UBA and the lower buffer access signal LBA.

Hence, by obtaining the logical product AND of the high-level signal output from the D-type flipflop circuit 601 and the high-level signal equ output from the match detection circuit 304, the AND circuit 602 outputs a high-level reset signal RST which instructs the resetting of the counted value adr of the address counter circuit 251. As a result, the counted value adr of the address counter circuit 251 is reset, and a region of the buffer 250 specified by the reset counted value, is specified as the access destination of the issued upper buffer access signal UBA and lower buffer access signal LBA.

Although the embodiment described above is applied to the memory card 20 having the flash memory 21, the present invention is of course applicable to any type of memories and memory devices.

Further, the present invention is not limited to these embodiments, but various variations and modifications may be made without departing from the scope of the present invention.

What is claimed is:

1. A buffer access control circuit for carrying out a process of updating an address one by one when consecutively accessing an upper buffer and a lower buffer as an access destination with respect to a buffer which is divided into the upper buffer and the lower buffer which are assigned the same address, said buffer access control circuit comprising:
a first latch circuit which latches data in response to generating a lower buffer access signal for accessing the lower buffer;
a second latch circuit which latches said data in response to generating an upper buffer access signal for accessing the upper buffer;
a detection circuit which detects whether data latched by said first latch circuit and data latched by said second latch circuit match; and
a modifying circuit which inputs said data to said first and second latch circuits, or inverts said data and inputs said inverted data to said first and second latch circuits when one of the upper and lower buffer access signals is generated and said detection circuit detects the match.

2. A memory unit comprising:
a buffer divided into an upper buffer and a lower buffer which are assigned the same address; and
a buffer access control circuit which carries out a process of updating an address one by one when consecutively accessing the upper buffer and the lower buffer as an access destination,
said buffer access control circuit comprising:
a first latch circuit which latches data in response to generating a lower buffer access signal for accessing the lower buffer;
a second latch circuit which latches said data in response to generating an upper buffer access signal for accessing the upper buffer;
a detection circuit which detects whether or not data latched by said first latch circuit and data latched by said second latch circuit match; and
a modifying circuit which inputs said data to said first and second latch circuits, or inverts said data and inputs said inverted data to said first and second latch circuits when one of the upper and lower buffer access signals is generated and said detection circuit detects the match.

* * * * *